United States Patent [19]

Taylor et al.

[11] Patent Number: 4,971,946
[45] Date of Patent: Nov. 20, 1990

[54] PROCESS FOR PREPARING A NOVEL SUPERCONDUCTOR WITH HIGH DENSITY AND HARDNESS USING HEATING STEPS AND HIGH PRESSURE COMPACTING

[75] Inventors: Jenifer Taylor, Almond, N.Y.; Prinya Sainamthip, North Brunswick, N.J.; David F. Dockery, Alfred Station, N.Y.

[73] Assignee: Alfred University, New York, N.Y.

[21] Appl. No.: 204,519

[22] Filed: Jun. 9, 1988

[51] Int. Cl.$^5$ .......................... C01F 1/00; C01F 17/00; C01G 3/02; C04B 35/60
[52] U.S. Cl. ........................................ 505/1; 252/518; 252/521; 419/53; 423/605; 423/635; 501/123; 505/725; 505/742
[58] Field of Search ...................... 419/53; 505/1, 725, 505/742; 252/518, 521; 423/604, 635; 501/123, 157

[56] References Cited

PUBLICATIONS

Katayama-Yoshida "Growth of Y Baz Cu$_3$O$_{7-d}$ Single Crystals", *Jp. Jnl. of App. Phys.* vol. 26 (12) Dec. 1987, pp. L2007–L2009.
Ishizawa "Superconducting Proerties of Highly oriented . . . ", *Jap. Jnl. Appl. Phys.* vol. 26, No. 5, May 1987, p. L676–L677.
Swaminathan "Thermal Stability of Superconducting YBaz Cu$_3$O$_{7-x}$", *Materials Lettters* vol. 6, No. 8,9, May 1988.
Matacotta "Determination of the Oxy. content In . . . YBa$_2$Cu$_3$O$_{7-X}$ . . . ", *Mat. Res. Soc. Symp. Proc.* vol. 99, 1988 Nov. 30–Dec. 4, 1987, pp. 561–565.
Shi "Sintering of Y Ba$_2$Cu$_3$O$_{7-x}$ Compacts", *Argonne National Laboratory* recieved 3/22/88.
Shyu et al. "Amealing Effects on Properties of . . . YBa$_2$Cu$_3$O$_{7-X}$ . . . ", Mot. Res, Soc. Symp. Proc. vol. 99:1988, 11/30–12/4/87, pp/ 655–658.
Han "Electrical Conductivity and thermograuimetic Studies of . . . YBu$_2$Cu$_3$O$_x$", *Mot. Res. Soc. Symp. Proc.* vol. 99:1988 11/30–12/4/87 pp. 753–756 .
Tien "Hot Isostatic Pressing (HIP) For the Densification of Oxide Super", *Ex. Abstracts High-temp. Super. II*, Apr. 5–9 1988, pp. 73–76.
Politis "Superconducitvity above 100K in Multi-Phase Y-Br-Cu-O", *Z. Phys. B-Condensed Matter* 66 pp. 279–282, 1987 .
Dinger "Fracture Toughness Measurement of YBa$_2$Cu$_3$O$_x$ Single Crystals", *IBM Yorktown Heights*, 7/1987 (recieved) Preprint: pp. 2–11.
Greedan "Crystal Structures and Supercon. in La-Ba-Cu$_3$-O System", *Mat. Res. Soc. Symp. Proc:* 1988 11/30–12/4/89 pp. 749–752,
Kubo "Effect of Oxy. Deficiency on the Crystal Structure . . . Ba$_2$Cu$_3$O$_y$", *Jpn. Jnl of applied Phys.* vol. 26(5) May 1987, p.L768–L770.
Mckittrick "apid Solidification of YBa$_2$Cu$_3$O$_7$ . . . ", *Mat. Res. Soc. Symp. Proc.* vol. 94:1989 11/30–12/4/87 pp. 567–570.
Nyang "Porosity, density and hardness of Y–Ba–Cu high Tc syper.", *Jnl of. Mat. Sci Letters* 7 4/1988 pp. 801–803.
Patel "Electrical, Mechanical and Ultra Sonic Properties of Sintering aid . . . ", *Adv. Cer. Mat'ls* vol. 2, No. 3B, Special Issue 1987, p. 615–623.
Kumakura "Large Magnetiazation in YBa$_2$ Cu$_3$O$_7$ Prepared . . . ", Jap. Jnl. of App. Phys. Lett. vol. 27, No. 2, Feb. 1988, pp. L188–L190.
Taylor "Sintering Time and Temperature for Ba$_2$YCu$_3$O$_{7-x}$", *MrS:* vol. 99 Nov. 30–Dec. 4, 1987, pp. 663–666.
Serverin "Microcracking and Mechanical Properties of Y Bu$_2$Cu$_3$O$_x$ . . . ", *British Ceramic Proceedings* vol. 40, 1988, pp. 249–256.

*Primary Examiner*—Paul Lieberman
*Assistant Examiner*—John Boyd
*Attorney, Agent, or Firm*—Howard J. Greenwald

[57] ABSTRACT

There is disxlosed a process for preparing a novel superconducting material. This material has the formula YBa$_2$Cu$_3$O$_{7-x}$ wherin x is equal to or less than 0.3, the material has a bulk density of from about 90 to about 96 percent, and the hardness of the material is in excess of 5.0 GigaPascals.

In the first step of the process, there is provided a pure powder comprised of barium, yttrium, and copper in a mole ratio of 2/1/3. Such powder is comprised of less than 1.0 mole percent of impurity.

In the second step of the process, the powder is compacted. Thereafter, the compacted powder is fired at a temperature of from about 1,000 to about 1,300 degrees Clesius for a period not exceeding 12 hours.

In the third step of the process, the temperature of the fired powder is reduced at least 20 degrees Celsius to a first reduced temperature within the range of from about 960 to about 990 degrees Celsius, and the powder is than held within this reduced temperature range for at least 1 hour.

In the fourth step of the process, the powder is cooled to a second reduced temperature within the range of from about 400 to about 700 degrees Celsius, and the powder is then held within the second reduced temperature range for from about 1 to about 24 hours.

During the firing and heat-treating steps, an oxygen-containing gas is flowed over the compacted powder at a flow rate of from about 0.25 to about 2.0 liters per minute.

15 Claims, No Drawings

PROCESS FOR PREPARING A NOVEL SUPERCONDUCTOR WITH HIGH DENSITY AND HARDNESS USING HEATING STEPS AND HIGH PRESSURE COMPACTING

FIELD OF THE INVENTION

A process for peparing a novel $YBa_2Cu_3O_{7-x}$ superconductor in which a pure powder composed of barium/ytrrium/copper oxide in a 2/1/3 molar ratio is first compacted, heated at a temperature of from 1,000 to about 1,300 degrees Celsius, cooled at least 20 degrees Celsius to a temperature of from about 960 to about 990 degrees Celsius, maintained at this reduced temperature for at least about 1 hour, cooled to a temperature of from about 400 to about 700 degrees Celsius, and then maintained at this temperature for from about 1 to about 24 hours.

BACKGROUND OF THE INVENTION

The 2/1/3 superconductor, which has the formula $YBa_2Cu_3O_{7-x}$, wherein x is equal to or less than 0.3, is well known to those skilled in the art. Thus, e.g., it is described in an article by M. K. Wu, et al. appearing in Physical Review Letters 58, 908 (1987).

The 2/1/3 superconductor is known to be highly sensitive to water. Thus, in an article by M. F. Yan et al. entitled "Water Interaction with the Superconducting $YBa_2Cu_3O_7$ Phase," Applied Physics Letters 51 (1987), at pages 532–534, the authors disclose that the 2/1/3 superconductor is ". . . highly sensitive to water and water vapor. . . ", and that its ". . . superconductivity is also greatly degraded by the interaction with water and humid air." In order to overcome this problem, the authors suggest that: "Applications of this and similar materials which involve a nonequilibrium oxidation state will probably require protection from ambient water."

Other authors have also discussed the adverse effects of water upon the properties of the 2/1/3 superconductor. See, e.g., an article by K. G. Frase et al. entitled "Environmental and Solvent Effects on Yttrium Barium Cuprate. . . ," Advanced Ceramic Materials, Vol. 2, No. 3B, Special Issue, 1987. Also see an article by I. Nakada et al. entitled "Two crystal Phases in the Superconducting Ba-Y-Cu-O Systems and Their Reactivity to Water," Japanese Journal of Applied Physics, Issue No. 5, May, 1987, pages L697–L698.

It is an object of this invention to provide a 2/1/3 superconductor which does not decompose substantially when exposed to water.

SUMMARY OF THE INVENTION

In Accordance with this invention, there is provided a process for preparing a superconducting material of the formula $Ba_2YCu_3O_{7-x}$, wherein x is equal to or less than 0.3, comprising the steps of sequentially: 1. providing a pure powder comprised of barium, yttrium, and copper in a mole ratio of 2/1/3, wherein said powder is comprised of less than 1.0 mole percent of impurity; 2. compacting said pure powder; 3. firing the compacted powder at a temperature of from about 1,000 to about 1,300 degrees Celsius for a period not exceeding 12 hours; 4. reducing the temperature of the fired powder at least 20 degrees Celsius to a temperature of from about 960 to about 990 degrees Celsius, and then maintaining the fired powder within this reduced temperature range for at least about 1 hour; 5. cooling the powder to a temperature of from about 400 to about 700 degrees Celsius; and 6, maintaining the cooled powder within the range of from about 400 to about 700 degrees Celsius for from about 1 to about 24 hours.

DESCRIPTION OF THE PREFERRED EMBODIMENTS

In the first step if this process, a pure 2/1/3 superconductor powder is provided. The powder is preferably phase pure, that is, when measured by X-ray diffraction means in accordance with the procedure specified below, it is shown to contain less than 1 volume percent of impurities.

This pure 2/1/3 powder can be made by means well known to those skilled in the art by utilizing substantially stoichiometric amounts of barium, yttrium, and copper compounds. Thus, by means of illustration and not limitation, one can use the technique described by M. Heuberger et al. in an article entitled "The Reproducible Production of Pure Superconducting $Ba_2YCu_3O_x$," appearing in Volume 5, number 11.12 of Materials Letters (October, 1987) at pages 489–494. In the process described in this paper, the disclosure of which is hereby incorporated by reference into this specification, a mixture of barium carbonate, cuprous oxide, and yttrium nitrate hexahydrate were mixed in a vibratory mill for 30 minutes with no grinding media. Thereafter, the mixture was hand ground with an agate mortar and pestle. The mixed batch was then calcined in thin layers on alumina setters in air at 830 degrees centigrade for 12 hours.

Another process for preparing the pure 2/1/3 powder is described in an article by S. Jin et al. entitled "Critical Current Density of the $YBa_2Cu_3O_{7-x}$ Superconductor as Affected by Microstructure Control," Materials Research Society Symposium Proceedings, Vol. 99, Materials Research Society, 1988, the disclosure of which is also incorporated by reference into this specification. Other means for providing the pure 2/1/3 powder with the stoichiometry required to produce the 2/1/3 semiconductor are well known to those in the art.

The 2/1/3 powder provided in the process of this invention contains less than 1 volume percent of impurities, as determined by X-ray powder diffraction. The analysis is conducted on a Seimens D-500 Diffractomer (manufactured by Seimens Company of Munich, West Germany) using a 5 second count and 0.02 degrees step. The analysis technique is well known to those skilled in the art and is described in, e.g. "Advances in Materials Characterization," Vol. 1, edited by D. R. Rossington et al. (Plenum Press, Alfred, New York, 1983), pages 449–464, the disclosure of which is hereby incorporated by reference into this case.

The pure 2/1/3 powder is preferably then ground so that 100 percent of its particles are smaller than 270 mesh (53 microns). The powder can be ground by conventional means. Thus, it may be ground in a mortar and pestle. Thus, it may ground by a Sweco vibratory mill with zirconia media. Thus, it may be ground in a laboratory ball mill with zirconia media. In one embodiment, 3/8 inch zirconia media is utilized.

In one embodiment, the pure 2/1/3 powder is compacted without being first ground.

It is preferred, however, to grind the pure 2/1/3 powder prior to compacting it. After this grinding, the powder is compacted to pellets in order to increase the green density. The compacting of the 2/1/3 powder may be conducted by means well known to those skilled in the art.

In one preferred embodiment, the powder is pressed into pellets at a pressure of from about 100 to about 170 megaPascals. It is preferred to use a pressure of from about 120 to about 140 megaPascals in the compacting. The most preferred compacting pressure is about 130 megaPascals.

In one embodiment, the powder is compacted in a cylindrical die with an internal diameter of from about 1.0 to about 1.5 inches and a surface area on its bottom face of from about 0.7 to about 1.8 square inches. From about 5 to about 20 grams of material are charged to the die, and the resulting compacted disc is generally from about 0.5 to about 2.0 centimeters thick.

The compacted powder is then fired at a temperature of from about 1,000 to about 1,300 degrees Celsius for a period of time not exceeding 12 hours. It is preferred to fire the compacted powder at a temperature of from about 1,000 to about 1,100 Celcius for a period not exceeding 4 hours. It is more preferred to sinter the compacted powder at a temperature of from about 1,030 to about 1,070 degrees Celsius for from about 2 to about 3 hours. In an even more preferred emobodiment, the powder is fired at a temperature of from about 1,040 to about 1,060 degrees Celsius for about 2.5 hours. In the most preferred embodiment, the sintering temperature is 1,050 degrees Celsius.

It is preferred to fire the compacted powder in a furnace or kiln under an oxygen-containing gas, such as flowing oxygen. The oxygen-containing gas flow rate ranges from about 0.25 to about 2.0 liters per minute. The preferred flow rate is about 0.7 to about 1.5 liters per minute. In the most preferred embodiment, the flow rate is about 1.0 liter per minute.

Oxygen is the preferred oxygen-containing gas. Other oxygen-containing gases, such as air, also may be used.

It is preferred to use an atmosphere-controlled furnace or kiln in order to regulate the flow of the oxygen-containing gas over the sample. Suitable furnaces or kilns include tube furnaces.

In one embodiment, the heating rate of the furnace is 300 degrees per hour.

After the compacted powder has been fired at a temperature of from about 1,000 to about 1,300 degrees Celsius, the firing temperature is reduced at least 20 degrees to a temperature within the range of from about 960 to about 990 degrees Celsius. It is preferred to reduce the firing temperature at least about 50 degrees to a temperature within the range of from about 970 to about 985 degrees Celsius. In the most preferred embodiment, the temperature of firing is reduced at least about 60 degrees to a temperature of about 980 degrees Celsius. During the time the temperature is being reduced, the sample is preferably maintained under the oxygen-containing gas flow.

Once the reduced temperature has been obtained, the sample is preferably maintained within the specified range of reduced temperatures and under the same oxygen-containing gas flow as before for a period of from about at least about 1 hour and, preferably, from about 1 to about 24 hours. Thus, if the temperature is reduced to, e.g., 970 degrees Celsius, the powder may then be maintained at either 970 degrees Celsius or, alternatively, at any temperature within the specified range of 960 to 990 degrees Celsius. It is preferred to maintain the sample under these conditions for from about 5 to about 18 hours. In a more preferred embodiment, the sample is maintained under these conditions for from about 9 to about 15 hours. In the most preferred embodiment, the sample is maintained under these conditions of about 12 hours.

After the sample has been heated under the reduced temperature conditions for the specified period of time, it is then cooled to a temperature of from about 400 to about 700 degrees Celsius and, preferably, to about 550 about 600 degrees Celsius. Thereafter, while the sample is still preferably maintained under the flow of oxygen-containing gas, it is maintained at or within the range of the second reduced temperature for from about 1 to about 24 hours. Thus, e.g., if the second reduced temperature used is 550 degrees, the powder may be maintained at either 550 degrees or, alternatively, at any temperature within the specified range of from 400 to 600 degrees Celsius. It is prefered to maintain the sample at this temperature and/or within this range for from about 2 to about 18 hours. In one embodiment, the sample is maintained at this temperature or within this range for from about 11 to about 13 hours.

Thereafter, the sample is cooled to room temperature and removed from the oven. The product thus produced has a bulk density of from about 90 to about 96 percent.

The bulk density of the sample may be determined in accordance with means well known to those skilled in the art. Thus, e.g., one may use the procedure described in A.S.T.M. Standard Test C-373-72 (Reapproved 1982), the disclosure of which is hereby incorporated by reference into this specification.

In one preferred embodiment, the superconductor produced by the process of this invention has improved physical properties. In this embodiment, the superconductor has a hardness in excess of 5.0 GigaPascals. In an even more preferred embodiment, the hardness of the superconductor is in excess of 7.0 GigaPascals. Hardness may be measured by a modified A.S.T.M. Standard Test. Test procedure A.S.T.M. C-849-81 is used with the exception that a Vickers Indentor was used instead of the Knoop Indentor; said A.S.T.M. test procedure is hereby incorporated by reference into this specification. This modified test procedure is also described in an article by N. D. Patel et al. appearing in Advanced Ceramic Materials, Vol. 2, No. 3B, Special Issue, 1987, the disclosure of which is hereby incorporated by reference into this specification. In it noteworthy that the hardness of the superconductor produced by Patel et al. was only about 2.5 GigaPascals.

The superconductor produced by the process of this invention is substantially more durable than prior art ceramic superconductors. It retains substantially more of its superconducting properties when subjected to aging.

The apparent Meissner effect is an indication of superconductivity. This effect can be measured with a specified superconducting sample. This sample will have a circular cross-section with a diameter of 1.0 inch, and it will be 0.25 inches thick.

In the test to evaluate the apparent Meissner effect, a specified permanent magnet is used. This test magnet is prepared from a magnet which consists of a samarium-cobalt alloy and which is sold by the Edmund Scientific Company of New Jersey (part number E30279) which has a field strength of 8,000 Gauss and a magnetic intensity of 7000 oersteds. In order to prepare the test magnet, the Edmund Scientific magnet is cut into a square shape with a thickness of 3.5 milmeters and with each side being 6 millimeters.

In this test, the sample is cooled down to liquid nitrogen temperature by pouring liquid nitrogen over it. Thereafter, the test magnet is lowered down on top of the sample until it levitates by itself. Then, the distance between the top face of the sample and the bottom face of the magnet is measured and recorded in millimeters.

The superconductor produced by the process of this invention has an apparent Meissner effect after aging which is at least 90 percent as great as the time zero apparent Meissner effect. The aging test involves first measuring the apparent Meissner effect at time zero. Thereafter, the sample is submerged in water at ambient temperature. Thereafter, its apparent Meissner effect is again measured and compared with the time zero apparent Meissner effect.

The following examples are presented to illustrate the invention but are not to be deemed limitative thereof. Unless otherwise specified, all parts are by weight and all temperatures are in degrees Celsius.

EXAMPLE 1

37.82 grams of reagent grade yttrium oxide, 132.22 grams of reagent grade barium carbonate, and 79.96 grams of reagent grade cupric oxide were mixed with about 500 milliliters of deionized water. 120 cylindrical zirconia media with a diameter of ⅜" were charged to the mixture, and the mixture was ball milled in a laboratory ball mill for 8 hours.

The milled slurry was placed into an oven and dried at a temperature of 80 degrees Celsius for 12 hours.

The dried powder was placed onto a alumina setter and calcined in a laboratory oven at a temperature of 850 degrees Celsius for 24 hours under flowing oxygen; the oxygen flow rate was 1.5 liters per minute.

The calcined powder was then ground in an alunina mortar and pestle until all of its particles passed through a 270 mesh screen (53 microns). Thereafter the ground powder was compacted.

7 grams of the ground powder were charged into a circular, stainless steel die with an internal diameter of 1.0 inch, and thereafter it was compacted with a circular press using a pressure of 150 megaPascals.

The compacted disc was then placed onto an alumina setter with a layer of calcined powder between the setter and the sample; the layer of the calcined powder was about 0.125 inches thick. The setter containing the sample was then placed into a tube furnace with a tube with a 3.625 inches inner diameter equipped with a source of oxygen; a Lindberg Type 54559-V furnace (manufactured by General Signal Company of Watertown, Wis.) was used, and oxygen was supplied by a tank sold by Linde Air Products Company of Danbury, Conn.

Then sample was placed in the furnace, and the temperature of the oven was raised to 1,040 degrees Celsius over a period of 5.5 hours. Thereafter, the sample was maintained a temperature of 1,040 degrees Celsius for 2.5 hours.

While it was still in the furnace under flowing oxygen, the temperature of the sample was reduced to 980 degrees Celsius over a period of about 30 minutes. Thereafter, the sample was maintained at 980 degrees Celsius under the flowing oxygen for 21.5 hours.

The sample was then cooled in the oven to a temperature of 540 degrees Celsius while under flowing oxygen over a period of about 3.0 hours. Thereafter, the sample was maintained at 540 degrees Celsius under flowing oxygen for 12 hours.

The sample was then furnace cooled to room temperature while under flowing oxygen.

The cooled sample was evaluated. It had a hardness of 6.1 GigaPascals when measured in accordance with the procedure described in the specification. It exhibited a very strong apparent Meissner effect.

EXAMPLE 2

The procedure of EXAMPLE 1 was substantially followed with the exception that the sample was maintained for 7.0 hours at 980 degrees Celsius.

EXAMPLE 3

The procedure of EXAMPLE 1 was substantially followed with the exceptions the sample was held at 1,040 degrees Celsius for 4.0 hours, and its temperature was then directly reduced to 540 degrees Celsius over a period of about 4.0 hours.

EXAMPLES 4–6

The procedure of EXAMPLE 3 was substantially followed with the exceptions that different firing temperatures and different holding times were used. In EXAMPLE 4, the sample was fired at a temperature of 1100 degrees Celsius for 2.5 hours. In EXAMPLE 5, the sample was fired at 1,048 degrees Celsius for 2.5 hours. In EXAMPLE 6, the sample was fired at 1,033 degrees Celsius for 2.5 hours.

What is claimed is:

1. A process for preparing a superconducting material of the formula $YBa_2Cu_3O_{7-x}$, wherein x is equal to or less than 0.3, wherein said material has a bulk density of from about 90 to about 96 percent, and wherein said material has a hardness in excess of 5.0 GigaPascals, comprising the steps of sequentially:
   (a) providing a pure oxide powder comprises of barium, yttrium and copper in a mole ratio of 2/1/3, wherein said powder is comprised of less than 1.0 mole percent of impurity;
   (b) compacting said pure powder at a pressure of from about 100 to about 170 megaPascals;
   (c) firing the compacted powder at a temperature of from about 1,030 to about 1,070 degrees Celsius for a period not exceeding 12 hours;
   (d) reducing the temperature of the fired powder to a first reduced temperature within the range of from about 960 to about 990 degrees Celsius, and then maintaining the fired powder within said range of said first reduced temperature for at least about 1 hour;
   (e) cooling the powder to a second reduced temperature within the range of from about 400 to about 600 degrees Celsius; and
   (f) maintaining the cooled powder within said second reduced temperature range for from about 1 to about 24 hours;
   wherein, during said steps (c), (d), (e), and (f), an oxygen-containing gas is flowed over the compacted powder at a flow rate of from about 0.25 to about 2.0 liters per minute.

2. The process as recited in claim 1, wherein said compacted powder is fired at a temperature of from about 1,030 to about 1,070 degrees Celsius for a period not exceeding four hours.

3. The process as recited in claim 2 wherein, prior to the time said powder is compacted, it is ground so that substantially 100 percent of its particles are smaller than 53 microns.

4. The process as recited in claim 3 wherein said compacted powder is fired at a temperature of from about 1,030 to about 1,070 degrees Celsius for from about 2 to about 3 hours.

5. The process as recited in claim 4 wherein, after said compacted powder has been fired, its temperature is reduced at least 50 degrees Celsius and it is maintained within the range of from about 970 to about 985 degrees Celsius for from about 1 to about 24 hours.

6. The process as recited in claim 5 wherein, after said compacted powder has been fired and its temperature has been reduced at least 50 degrees Celsius, it is maintained within said reduced temperature range of from about 970 to about 985 degrees Celsius for from about 5 to about 18 hours.

7. The process as recited in claim 6 wherein said fired powder is maintained within the range of from about 970 to about 985 degrees Celsius for from about 9 to about 15 hours.

8. The process as recited in claim 7, wherein said fired powder is maintained within the range of from about 970 to about 985 degrees Celsius for about 12 hours.

9. The process as recited in claim 7 wherein said powder is compacted at a pressure of from about 120 to about 140 MegaPascals.

10. The process as recited in claim 9 wherein said compacted powder is fired at a temperature of from about 1,040 to about 1,060 degrees Celsius.

11. The process as recited in claim 10 wherein said oxygen-containing gas is oxygen.

12. The process as recited in claim 11 wherein said oxygen is flowed over said compacted powder at a flow rate of from about 0.7 to about 1.5 liters per minute.

13. The process as recited in claim 12, wherein said second reduced temperature is from about 550 to about 600 degrees Celsius.

14. The process as recited in claim 13 wherein, after said fired powder has been cooled to said second reduced temperature range, it is maintained within this temperature range for from about 2 to about 18 hours.

15. The process as recited in claim 14 wherein the fired powder is maintained within the second reduced temperature range for from about 11 to about 13 hours.

* * * * *